(12) United States Patent
Song et al.

(10) Patent No.: US 6,275,089 B1
(45) Date of Patent: Aug. 14, 2001

(54) LOW VOLTAGE CONTROLLABLE TRANSIENT TRIGGER NETWORK FOR ESD PROTECTION

(75) Inventors: Jun Song; Ting Cheong Ang, both of Singapore (SG); Shyue Fong Quek, Petaling Jaya (MY); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/482,048

(22) Filed: Jan. 13, 2000

(51) Int. Cl.[7] ........................................... H03K 5/08
(52) U.S. Cl. ..................... 327/314; 327/320; 327/326; 327/328; 361/91.5
(58) Field of Search ..................... 327/309, 310, 327/312, 313, 314, 320, 326, 328; 361/56, 91.5, 91.6, 91.7, 93.1

(56) References Cited

U.S. PATENT DOCUMENTS

| | | | |
|---|---|---|---|
| 4,037,164 | * | 7/1977 | Pickton et al. .......................... 327/178 |
| 5,528,190 | * | 6/1996 | Honnigford .............................. 327/328 |
| 5,576,557 | * | 11/1996 | Ker et al. ................................ 361/111 |
| 5,631,793 | * | 5/1997 | Ker et al. ................................ 361/56 |
| 5,895,940 | * | 4/1999 | Kim ......................................... 257/173 |
| 5,905,288 | * | 5/1999 | Ker .......................................... 257/355 |
| 5,986,862 | * | 11/1999 | Kim ......................................... 361/56 |
| 6,008,974 | * | 12/1999 | Lee et al. ................................ 361/56 |
| 6,130,811 | * | 10/2000 | Gans et al. .............................. 361/56 |

* cited by examiner

*Primary Examiner*—Terry D. Cunningham
(74) *Attorney, Agent, or Firm*—George O. Saile; Rosemary L. S. Pike

(57) ABSTRACT

A transient protection circuit is described which provides electrostatic discharge (ESD) protection for an internal circuit of an IC. The transient protection circuit comprises two Zener diodes connected in series between the input pad and the internal circuit of the IC. A sufficiently large ESD pulse will drive one the two Zener diodes into breakdown mode, thereby reducing the magnitude of the ESD pulse to the remainder of the circuit. Resistive means are paralleled with the Zener diodes to provide a signal path at non-ESD voltages. To help shunt the ESD current away from the internal circuit, PMOS and NMOS transistors are connected in parallel between the positive and the negative voltage supply and their junction is connected to the internal circuit. Negative ESD pulses cause the PMOS transistors to turn on, dumping the ESD energy into the positive voltage supply, while positive ESD pulses cause the NMOS transistors to turn on, dumping the ESD energy into the negative voltage supply. Voltage changes, caused by currents flowing through the resistive means, trigger parasitic SCRs into conduction to provide the bulk of the ESD protection.

10 Claims, 2 Drawing Sheets

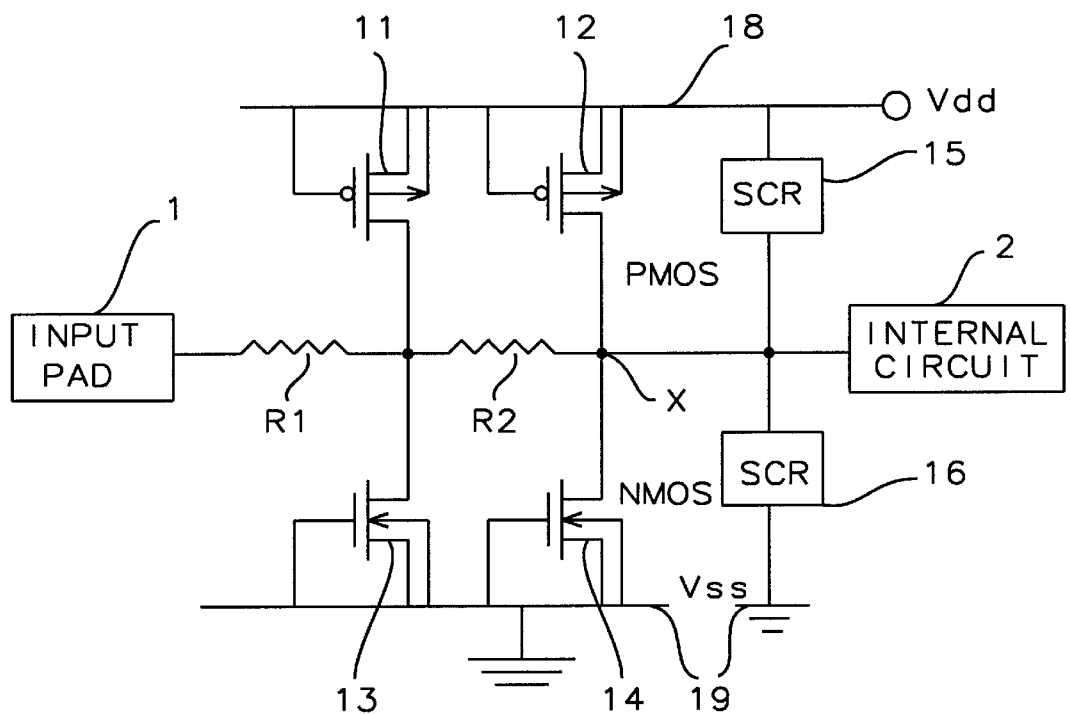
FIG. 1 – Prior Art
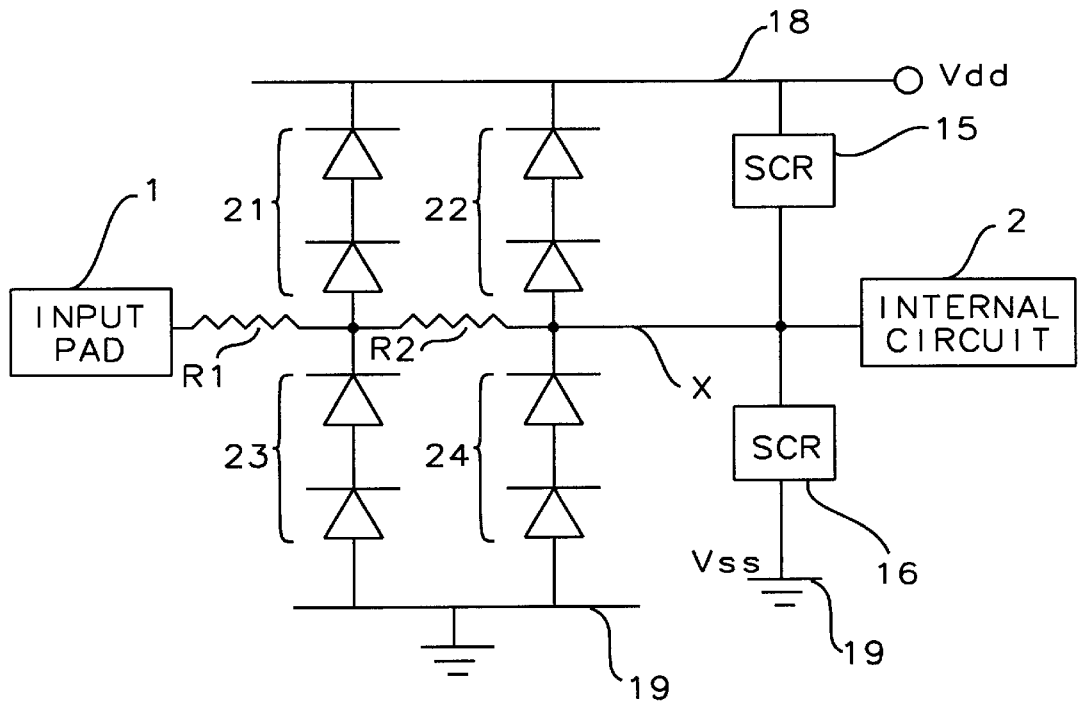
FIG. 2 – Prior Art

LOW VOLTAGE CONTROLLABLE TRANSIENT TRIGGER NETWORK FOR ESD PROTECTION

BACKGROUND OF THE INVENTION

1. Field of the Invention

The invention relates to an integrated electrostatic discharge (ESD) protection circuit, and more particularly to a low voltage trigger circuit utilizing parasitic devices for protecting from ESD.

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron devices while still allowing them to function unencumbered and without undue, or zero, increase of silicon real estate. The scaling down of CMOS technology into the deep submicron area of 0.25 micron and below has greatly degraded the robustness of the CMOS integrated circuits (IC).

A conventional ESD design typically consists of a two stage network, the first network comprising diodes, n- or p-channel transistors (NMOS or PMOS), and the second network comprising silicon controlled rectifiers (SCRs). The first stage should have the characteristics of fast transit time (turn on) and low trigger voltage. Because SCRs have a slower turn on and require a relatively high trigger voltage, the first stage is needed in order to provide a successful ESD protection. Thus, the performance of the first stage becomes important. Fast transit and low trigger voltage are the key criterion.

Typical circuits of the related art are shown in FIGS. 1 and 2 and will be discussed next. Turning now to FIG. 1, we show an input pad 1 connected via resistors R1 and R2 to internal circuit 2. A p-channel transistor 11 is connected between voltage supply 18 ($V_{dd}$) and the junction of resistors R1 and R2. A second p-channel transistor 12 is connected between voltage supply 18 and Point X, the input to internal circuit 2. The gates of both transistors 11 and 12 are tied to voltage supply 18. An n-channel transistor 13 is connected between the junction of resistors R1/R2 and voltage supply 19, $V_{SS}$, typically ground. A second n-channel transistor is connected between Point X and voltage supply 19. The gates of n-channel transistors 13 and 14 are also tied to voltage supply 19. Transistors 11 to 14 function as diodes since their gates are tied to their source. Two SCRs 15 and 16 are connected between $V_{dd}$ and $V_{ss}$, their junctions tied to Point X.

The circuit between input pad 1 and internal circuit 2 protects internal circuit 2 from ESD pulses in the following way, If there is a positive signal at input pad 1, which is about 0.6 Volt higher than $V_{dd}$, then transistors 11 and 12 turn on, and current will be discharged through them to $V_{dd}$. If there is a negative signal at input pad 1, which is about 0.6 Volt lower than ground, then transistors 13 and 14 turn on, and current will be discharged through them to ground. The current through R2 will raise or lower the potential at Point X which will trigger either SCR network 15 or 16 to further discharge the current and, therefore, protect the internal circuit 2.

Turning now to FIG. 2, we show an input pad 1 connected via resistor R1 and R2 to internal circuit 2. A diode string 21 of two diodes is connected between voltage supply 18 ($V_{dd}$) and the junction of resistors R1 and R2. A second diode string 22 is connected between voltage supply 18 and Point X, the input to internal circuit 2. The cathodes of diode strings 21 and 22 are connected to voltage supply 18, and the anodes are connected to either end of resistor R2. Similarly, a third diode string 23 is connected between the junction of resistors R1/R2 and voltage supply 19 ($V_{ss}$), typically ground, and a fourth diode string 24 is connected between Point X and voltage supply 19. The cathodes of diode strings 23 and 24 are connected to either end of resistor R2, and the anodes are to tied to voltage supply 19. Two SCRs 15 and 16 are connected between $V_{dd}$ and $V_{ss}$, their junctions tied to Point X.

The circuit between input pad 1 and internal circuit 2 protects internal circuit 2 from positive ESD pulses at input pad 1 in a similar way as described for FIG. 1. If there is a positive signal at input pad 1, which is about 1.2 Volt (two diode drops) higher than $V_{dd}$, then diode strings 21 and 22 become forward biased, and current will be discharged through them to $V_{dd}$. A negative signal at input pad 1 about 1.2 Volt lower than ground turns on diode strings 23 and 24 and current will be discharge through them to ground. The response of Point X and SCRs 15 and 16 is identical to the description for FIG. 1.

The disadvantages of the circuits of FIGS. 1 and 2 are that the discharge capabilities of transistors 11 to 14 and diodes 21 to 24 are limited. In order to increase the current capabilities these components would have to be made larger, which also increases their parasitic capacitances and consequently slows down their response.

U.S. Patents which relate to the subject of ESD protection for integrated circuits are:

U.S. Pat. No. 5,917,336 (Smith et al.) teaches an electrostatic discharge (ESD) circuit that provides robust protection to an input/output driver circuit. The discharge path is provided by a bipolar transistor. A combination of an n-type MOSFET, a string of diodes, and a biasing circuit trigger the bipolar device. The trigger point of the MOSFET is programmable by varying the number of individual diodes in the string of diodes. The relatively high transconductance of the n-type MOSFET allows the use of a smaller ESD circuit for a given degree of protection.

U.S. Pat. No. 5,530,612 (Maloney) describes a bias network in ESD protection device. The bias network is used to augment the diode string to distribute small but significant forward current to the diodes. Also employed is the use of cantilever diodes, which provide PNP Darlington gain block for ESD protection. Also described is a termination that supplies final base current to the gain block for a limited amount of time, so that ESD charge can be shunted harmlessly through the PNP chain, but assures that the structure draws no current from a stable power supply long term.

U.S. Pat. No. 5,631,793 (Ker et al.) illustrates a capacitor-couple electrostatic discharge (ESD) protection circuit for protecting an internal circuit and/or an output buffer of an IC from being damaged by an ESD current. The capacitor-couple ESD protection circuit includes an ESD bypass device for bypassing the ESD current, a capacitor-couple circuit for coupling a portion of voltage to the ESD bypass device, and a potential leveling device for keeping an ESD voltage transmitted for the internal circuit at a low potential level.

It should be noted that none of the above-cited examples of the related art combine a) the low trigger voltage and fast transit characteristics of a first stage network utilizing Zener diodes and MOS transistors with b) the discharge capabilities of parasitic bipolar transistors (SCRs) of the second network and c) the low device count. The preferred embodiment of the present invention described subsequently provides all of these important features.

SUMMARY OF THE INVENTION

It is an object of the present invention to provide a circuit which protects an internal circuit of an integrated circuit (IC) from the damaging effects of electrostatic discharge (ESD).

Another object of the present invention is to provide one type of circuit with a fast turn on time to ESD and a low trigger voltage, and another circuit which is capable of shunting high ESD currents safely.

A further object of the present invention is to provide a protection circuit of low device count.

These objects have been achieved by providing two Zener diodes in series connected between the input pad and the internal circuit and one or more CMOS transistor strings connected between a positive voltage supply and a negative voltage supply, where the junction of the PMOS and NMOS transistors is tied to the above mentioned internal circuit. The Zener diodes have their cathodes joined causing one diode to go into breakdown mode when an ESD pulse at the input pad exceeds the breakdown voltage, thus reducing the magnitude of the ESD pulse. Resistive means are paralleled with the diode string to provide a signal path at non-ESD voltages. Negative ESD pulses cause the PMOS transistors to turn on, dumping the ESD energy into the more positive voltage supply, while positive ESD pulses cause the NMOS transistors to turn on, dumping the ESD energy into the more negative voltage supply. Increased current through the resistive means increases the voltage across the parasitic SCRs of the internal circuit, thereby triggering them to function as ESD protection by dumping the bulk of the ESD current.

BRIEF DESCRIPTION OF THE DRAWINGS

FIG. 1 is a circuit diagram of the prior art.

FIG. 2 is another circuit diagram of the prior art.

DESCRIPTION OF THE PREFERRED EMBODIMENT

Figure 3:
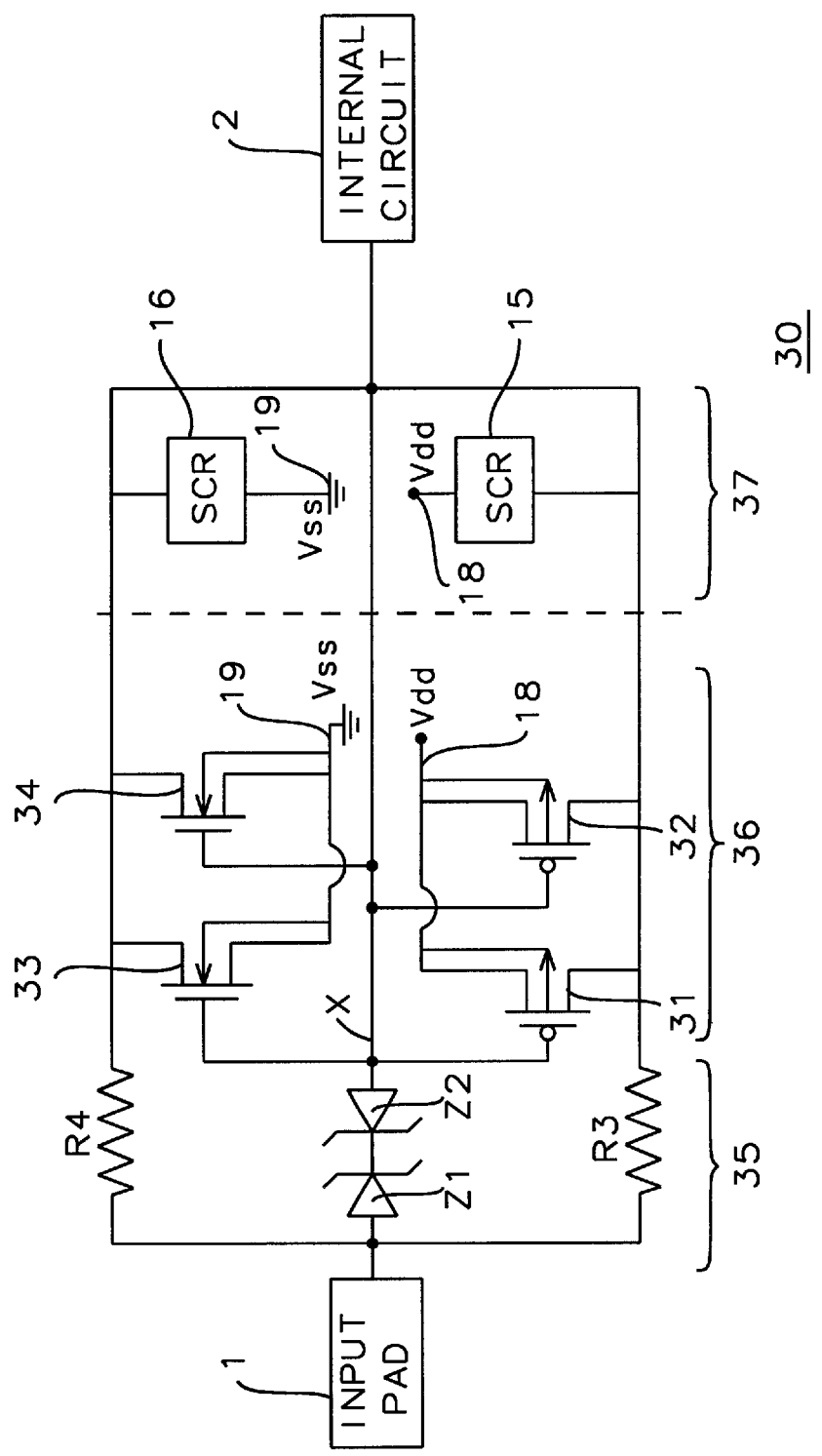
FIG. 3 is a circuit diagram of the preferred embodiment of the present invention.

Referring now to FIG. 3, we show a schematic of a preferred embodiment of a electrostatic discharge (ESD) protection circuit 30 used in an integrated circuit (IC) according to the present invention and utilizing a low voltage controllable transient trigger network. The circuit of FIG. 3 operates as follows:

Z1 and Z2 are Zener diodes which have a low breakdown (trigger) voltage. If the input signal is high enough (positive) Zener diode Z2 will break down first followed by n-channel transistors 33 and 34 turning on. Once turned on, current will discharge to ground through resistor R4 and transistors 33, 34, thereby protecting the Zener diodes. If the input signal is low enough (negative), Zener diode Z1 will break down first followed by p-channel transistors 31 and 32 turning on. Again, when they are turned on, current will discharge to $V_{dd}$ through resistor R3 and transistors 31, 32, protecting the Zener diodes. Because of current flowing through R3 or R4, the potential at Point X will change and trigger SCRs 15 and 16, causing them to function as ESD protection devices.

In FIG. 3 the electrostatic discharge (ESD) protection circuit 30 is installed between an input pad 1 and an internal circuit 2 of the IC, and includes a voltage limiting circuit 35 and a voltage clamp 36. SCRs 15 and 16 of SCR section 37, are parasitic devices of the internal circuit 2 and are the unavoidable byproduct of the IC device layout. The function of circuits 35 and 36 is to both trigger SCRs 15 and 16 and to prevent them from latching up. In FIGS. 1 to 3 like parts are identified by like numerals.

The voltage limiting circuit 35 limits the ESD voltage which is impressed at input pad 1. Circuit 35 comprises Zener diodes Z1, Z2 and resistors R3, R4. Zener diodes Z1 and Z2 provide a discharge path during an ESD pulse, and resistors R3 and R4 provide a signal path for non-ESD periods. The Zener diodes and resistor together represent a non-linear impedance at input pad 1. When the input pad sees voltages which exceed the breakdown voltage of reversed biased Zener diodes Z1 or Z2 (which diode is reverse biased depends on the polarity of the ESD pulse) the voltage at Point X changes, turning on either transistors 31, 32 or transistors 33, 34. On a negative ESD pulse Zener diode Z1 is reverse biased and on a positive ESD pulse Zener diode Z2 is reverse biased.

The voltage clamp 36 is connected between the internal circuit 2 of the IC and a first and a second voltage supply, where the first voltage supply 18 is typically $V_{dd}$ and the second voltage supply 19 is typically ground ($V_{ss}$) and where voltage supply 18 has a more positive potential than voltage supply 19. Voltage clamp 36 is comprised of at least one p-channel and one n-channel transistor (CMOS technology) each, which clamp an ESD pulse to a fixed magnitude. Their function will be explained shortly.

SCR section 37 is connected between voltage supply 18 and 19 and the junction of parasitic SCRs 15 and 16 is connected to the input of internal circuit 2, Point X. The SCRs function as ESD protection by dumping the bulk of the ESD current into the voltage supplies. The voltage across either SCR is limited to a value below the SCR's breakdown voltage to inhibit their destructive latchup.

Still referring to FIG. 3, Zener diodes Z1 and Z2 of voltage limiting circuit 35 are joined at their cathodes, while the anode of Z1 is connected to input pad 1, and the anode of Z2 is connected to internal circuit 2. Resistors R3 and R4 are connected between input pad 1 and internal circuit 2, i.e., the resistors are paralleled with Zener diodes Z1 and Z2. While two resistors are shown in this illustrative example, it is understood that one or more resistive means will function equally well.

Voltage clamp 36 is shown comprising a first and a second p-channel transistor 31 and 32, respectively, having their source-drain paths connected in parallel between voltage supply 18 and Point X and the gate also tied to Point X. The substrate of both transistors 31 and 32 is connected to voltage supply 18. Similarly a first and second n-channel transistor 33 and 34 have their drain-source path connected between Point X and the second voltage supply 19 (commonly ground), and their gates are similarly connected to Point X. The substrate of both transistors 33 and 34 is connected to voltage supply 19. FIG. 3 shows two p-channel and two n-channel transistors as an illustrative example; the number of transistors of each type may vary, however, to suit the needs of the designer, as is well understood by those knowledgeable in the art.

The function of voltage clamp 36 is to discharge the ESD current to protect the Zener diodes. A positive going ESD pulse at Point X turns on n-channel transistors 33 and 34, shunting the ESD current to voltage supply 19. Similarly, a negative going ESD pulse at Point X turns on p-channel transistors 31 and 32, shunting the ESD current to voltage supply 18. The p-channel transistors, with their gates tied to their drains, can be viewed as diodes, where the anode is connected to voltage supply 18 and the cathode to Point X. Similarly, the n-channel transistors, with their gates tied to their drains, can be viewed as diodes, where the anode is connected to Point X and the cathode to voltage supply 19. Both p-channel and n-channel transistors are realized by using parasitic transistors of the field region of internal circuit 2.

The arrangement of the p-channel and n-channel transistors 31–34 combined with the voltage change caused by the increased current flow through resistors R3 and R4 triggers SCRs 15 and 16, but also inhibits those parasitic SCRs from reaching or exceeding their breakdown voltage preventing their destructive latchup.

While the invention has been particularly shown and described with reference to the preferred embodiments thereof, it will be understood by those skilled in the art that various changes in form and details may be made without departing from the spirit and scope of the invention.

What is claimed is:

1. An electrostatic discharge (ESD) protection circuit for use in an integrated circuit (IC), comprising:
   a voltage limiting circuit for limiting the voltage impressed by an ESD on an input pad of said IC, said voltage limiting circuit connected between said input pad and an internal circuit of said IC, said voltage limiting circuit comprising diodes and at least one resistive means; and
   a voltage clamp disposed in a field region of said IC, said voltage clamp connected between said internal circuit of said IC and a first and a second voltage supply, said voltage clamp comprising two or more p-channel and two or more n-channel transistors, said voltage clamp clamping said ESD to a fixed magnitude.

2. The circuit of claim 1, wherein said resistive means provides a signal path to said internal circuit in the absence of said ESD.

3. The circuit of claim 1, wherein said diodes comprise a first and a second Zener diode each having an anode and a cathode, where said cathodes are connected together.

4. The circuit of claim 3, wherein said anodes of said first and said second Zener diode are connected between said input pad and said internal circuit.

5. The circuit of claim 3, wherein said first Zener diode when in breakdown mode turns on said p-channel transistors.

6. The circuit of claim 3, wherein said second Zener diode when in breakdown mode turns on said n-channel transistors.

7. The circuit of claim 1, wherein said resistive means are connected between said input pad and said internal circuit of said IC.

8. The circuit of claim 1, wherein said p-channel transistors having a source-drain path and a gate, said source-drain of each of said p-channel transistors connected between said first voltage supply and, said internal circuit of said IC, and said gate of each of said p-channel transistors connected to said internal circuit of said IC.

9. The circuit of claim 1, wherein said n-channel transistors having a drain-source path and a gate, said drain-source of each of said n-channel transistors connected between said internal circuit of said IC and said second voltage supply, and said gate of each of said n-channel transistors connected to said internal circuit of said IC.

10. The circuit of claim 1, wherein said first voltage supply has a more positive potential than said second voltage supply.

* * * * *